(12) United States Patent
Howell

(10) Patent No.: US 6,703,851 B1
(45) Date of Patent: Mar. 9, 2004

(54) TEST SOCKET INTERPOSER

(75) Inventor: Robert P. Howell, San Jose, CA (US)

(73) Assignee: Exatron, Inc., San Jose, CA (US)

( * ) Notice: Subject to any disclaimer, the term of this patent is extended or adjusted under 35 U.S.C. 154(b) by 31 days.

(21) Appl. No.: 10/213,045

(22) Filed: Aug. 5, 2002

(51) Int. Cl.[7] .............................................. G01R 1/073
(52) U.S. Cl. ..................................... 324/754; 324/755
(58) Field of Search ................................ 324/754, 755, 324/756, 758, 762, 765

(56) References Cited

U.S. PATENT DOCUMENTS

| | | | | |
|---|---|---|---|---|
| 5,811,982 A | * | 9/1998 | Beaman et al. | 324/754 |
| 6,208,025 B1 | * | 3/2001 | Bellaar et al. | 257/696 |
| 6,242,932 B1 | * | 6/2001 | Hembree | 324/755 |
| 6,373,273 B2 | * | 4/2002 | Akram et al. | 324/765 |
| 6,400,169 B1 | * | 6/2002 | Hembree | 324/755 |
| 6,426,642 B1 | * | 7/2002 | Akram et al. | 324/765 |
| 6,529,027 B1 | * | 3/2003 | Akram et al. | 324/756 |

* cited by examiner

*Primary Examiner*—Kamand Cuneo
*Assistant Examiner*—Jermele Hollington
(74) *Attorney, Agent, or Firm*—Blakely, Sokoloff, Taylor & Zafman, LLP; Stephen M. De Klerk

(57) ABSTRACT

The invention relates to a test socket interposer. The interposer includes a flexible substrate with an upper signal contact and an upper ground contact on its top surface and a lower signal and a lower ground contact on its bottom surface. A portion of an upper surface of the upper signal contact is higher and to the right of an upper surface of the ground contact so that a signal contact of a device contacts the upper signal contact before a device ground slug contacts the upper ground contact. Also, a downward force exercised by the device signal contact causes pivoting of the upper signal contact and the substrate is sufficiently flexible to allow for this pivoting of the upper signal contact.

21 Claims, 4 Drawing Sheets

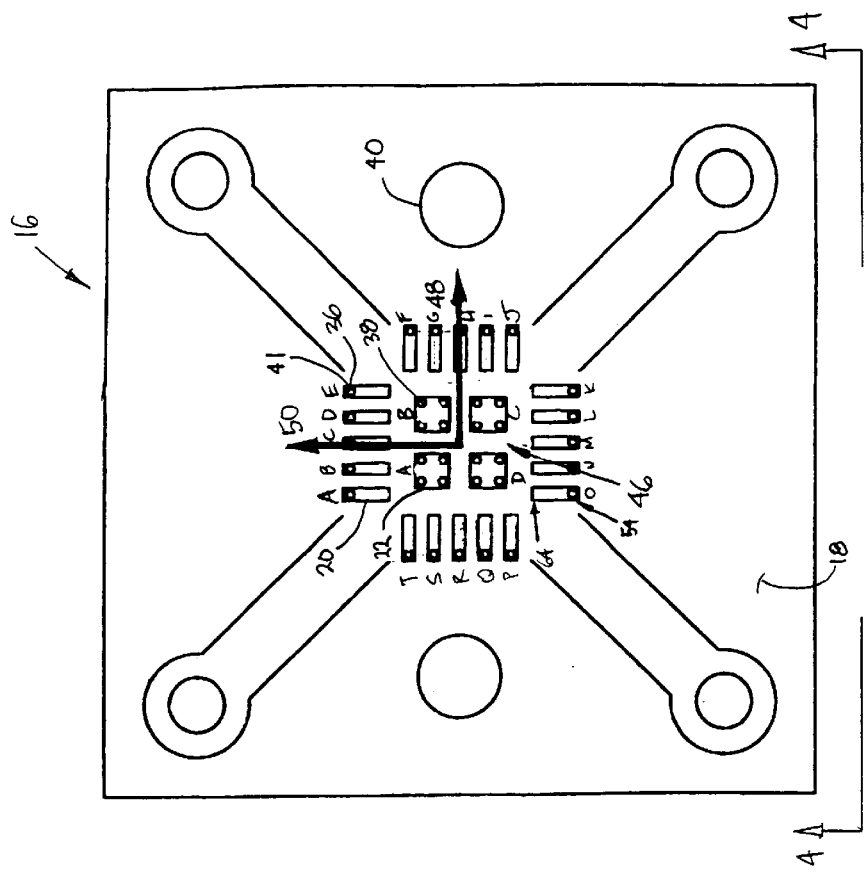
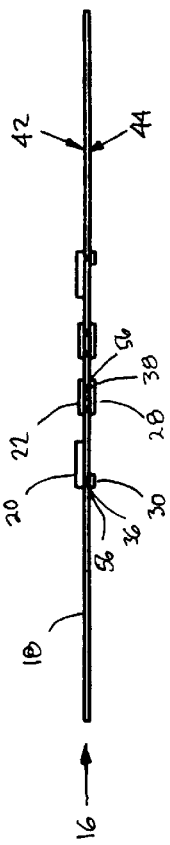
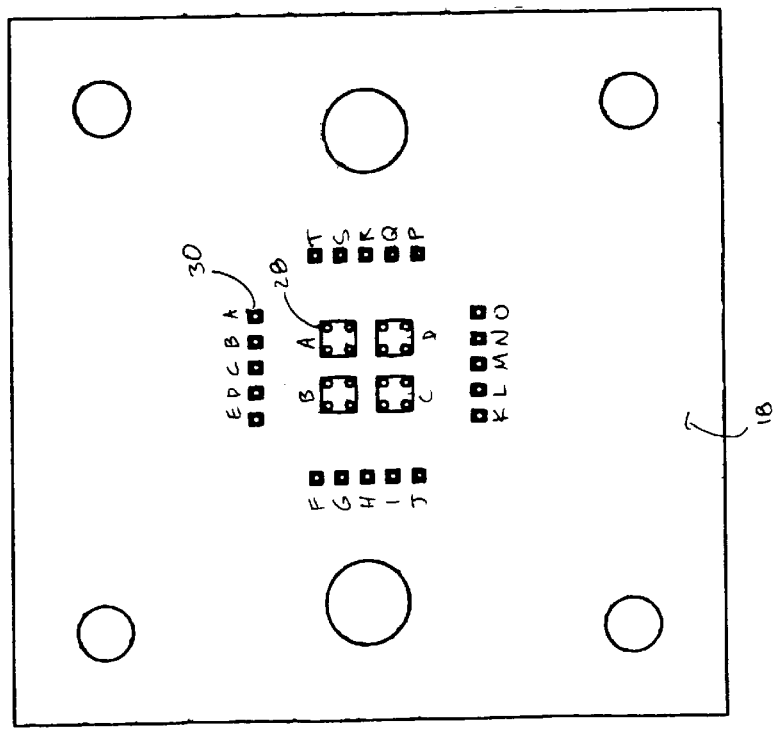

TEST SOCKET INTERPOSER

BACKGROUND OF THE INVENTION

1). Field of the Invention

This invention relates to a test socket interposer.

2). Discussion of Related Art

To ensure the quality of integrated circuit chips after manufacture, various testing methods have been devised to find defects. Frequently, testing of the electronic device is performed by subjecting it to a set of input conditions. The pass/fail response to these inputs will determine whether it can be delivered to a customer.

Effective testing of an electronic device requires good contact between a signal and ground contact of the electronic device and corresponding contacts on a test socket. During testing, a poor electrical contact may occur between the test socket and the electronic device. One of the reasons for poor electrical contact is non-uniformity of the dimensions of the signal contacts of the electronic device. One or more of the signal contact leads may fail to make full contact with the signal contact of the test socket. Poor electrical contact lowers the reliability of the testing and may impair the transfer of signals between the electronic device and the tester to the extent that a good chip may test as defective.

SUMMARY OF THE INVENTION

The invention provides a test socket interposer with a horizontal, nonconductive, flexible substrate with a top and bottom surface, a lower ground contact, and a lower signal contact on the bottom surface of the substrate, positionable on a test socket with the lower ground contact on a socket ground contact and with the lower signal contact on a socket signal contact, an upper ground contact and an upper signal contact on the top surface of the substrate, the upper signal contact having a surface, at least a portion of which (i) is higher than an upper surface of the ground contact so that a signal contact of a device in a common plane as a device ground contact contacts the upper signal contact before the device ground contact contacts the upper ground contact when the device is moved downward, and (ii) is to the right of a lower surface of the lower signal contact so that a downward force exercised by the device signal contact causes pivoting of the upper signal contact that moves the area of contact between the device signal contact and the upper signal contact downward, the substrate being sufficiently compliant to allow for pivoting of the upper signal contact, and for the device ground contact to subsequently contact the upper ground contact, and ground and signal electrical connections, the ground electrical connection linking the upper ground contact with the lower ground contact and the signal electrical connection linking the upper signal contact with the lower signal contact.

The substrate may have at least one tooling hole formed through the substrate for positioning over tooling pins, to position the substrate on the test socket.

The lower surface of the lower ground contact and the lower surface of the lower signal contact may be in a common plane and an air gap may be defined under a portion of the bottom surface of the substrate and above the test socket that is between the socket ground contact and socket signal contact to allow for flexing of the substrate between the lower ground contact and the lower signal contact.

The upper ground contact may be positioned on the top surface of the substrate directly above the lower ground contact.

The distance between the lower surface of the lower ground contact and the bottom surface of the substrate may be the same as the distance between the lower surface of the lower signal contact and the bottom surface of the substrate.

A downward force exercised by the device signal contact on the upper signal contact may cause the upper signal contact to press down against the substrate and form a depression in the top surface of the substrate material under the upper signal contact for the duration that the downward force is exercised.

The depression in the substrate material may be located under the side of the upper signal contact closest to the upper ground contact.

The distance between the upper surface of the upper signal contact and the top surface of the substrate may be greater than the distance between the upper surface of the upper ground contact and the top surface of the substrate.

At least one of the ground electrical connection linking the upper ground contact with the lower ground contact and the signal electrical connection linking the upper signal contact with the lower signal contact may be a via.

The test socket interposer may further include a conductive material filling the void in the via.

The test socket interposer may have a plurality of upper signal contacts.

One of the upper signal contacts may be positioned on the right side of the upper ground contact and one of the upper signal contacts may be positioned on the left side of the upper ground contact.

The upper surface of the upper signal contact on the right side and the upper surface of the upper signal contact on the left side may be the same distance above the top surface of the substrate.

The upper surfaces of the upper signal contacts may be higher than the upper surface of the upper ground contact so that a device including a signal contact on the right side of the device, a signal contact on the left side of the device, and a ground contact in a common plane with the device signal contacts, will make contact with the right and left upper signal contacts before the upper surface of the upper ground contact.

A downward force exercised by the right and left device signal contacts on the right and left upper signal contacts may cause pivoting of the upper signal contacts that moves the areas of contact between the right and left device signal contacts and the upper signal contacts downward, the substrate being sufficiently compliant to allow for pivoting of the upper signal contacts, and for the device ground contact to subsequently contact the upper ground contact.

A plurality of upper signal contacts may be all positioned on a perimeter of an area on the top surface of the substrate and the upper ground contacts may be all positioned on the top surface of the substrate in the area within the upper signal contacts.

At least two of the upper signal contacts may be in a line on the right side of the area and at least two of the upper signal contacts may be in a line on the left side of the area.

The invention also provides a test socket interposer with a horizontal, non-conductive, flexible substrate with a top and bottom surface, a lower ground contact and a lower signal contact on the bottom surface of the substrate, positionable on a test socket with the lower ground contact on a socket ground contact and with the lower signal contact on a socket signal contact, an upper ground contact and an upper signal contact on the top surface of the substrate, the upper signal contact having a surface, at least a portion of which (i) is higher than an upper surface of the ground contact and so that a signal contact of a device in a common plane as a device ground contact contacts the upper signal contact before the device ground contact contacts the upper ground contact when the device is moved downward, (ii) is located vertically above the top surface of the substrate a greater distance than the height of the upper ground contact measured from the top surface of the substrate, and (iii) is to the right of a lower surface of the lower signal contact so that a downward force exercised by the device signal contact causes pivoting of the upper signal contact by pressing the upper signal contact down against the substrate and forms a depression in the top surface of the substrate material under the upper signal contact allowing the area of contact between the device signal contact and the upper signal contact to move downward, the substrate being sufficiently compliant to allow for pivoting of the upper signal contact, and for the device ground contact to subsequently contact the upper ground contact and a ground and signal electrical connection in the substrate, the ground electrical connection linking the upper ground contact with the lower ground contact and the signal electrical connection linking the upper signal contact with the lower signal contact.

The invention further provides a method for testing a device using an interposer, the device having a signal contact and a ground contact, and the interposer having a substrate, a lower ground contact, a lower signal contact, an upper ground contact and an upper signal contact, including positioning the interposer on the test socket, moving a device downward until the device signal contact makes contact with the upper surface of the upper signal contact and before the device ground contact makes contact with the upper ground contact, exerting a downward force on the upper signal contact with the device signal contact to cause pivoting of the upper signal contact, the substrate material being sufficiently compliant to allow for a portion of an area of contact of the device and the upper signal contact to move downward to allow subsequent contact of the device ground contact with the upper ground contact and conducting electricity between the device and the test socket via the contacts.

BRIEF DESCRIPTION OF THE DRAWINGS

The invention is further described by way of examples with reference to the accompanying drawings, wherein:

FIG. 2 is a plan view of the test socket interposer;

FIG. 3 is a bottom view of the test socket interposer;

FIG. 4 is a side view on 4—4 in FIG. 2 of the test socket interposer;

DETAILED DESCRIPTION OF THE INVENTION

Figure 1:
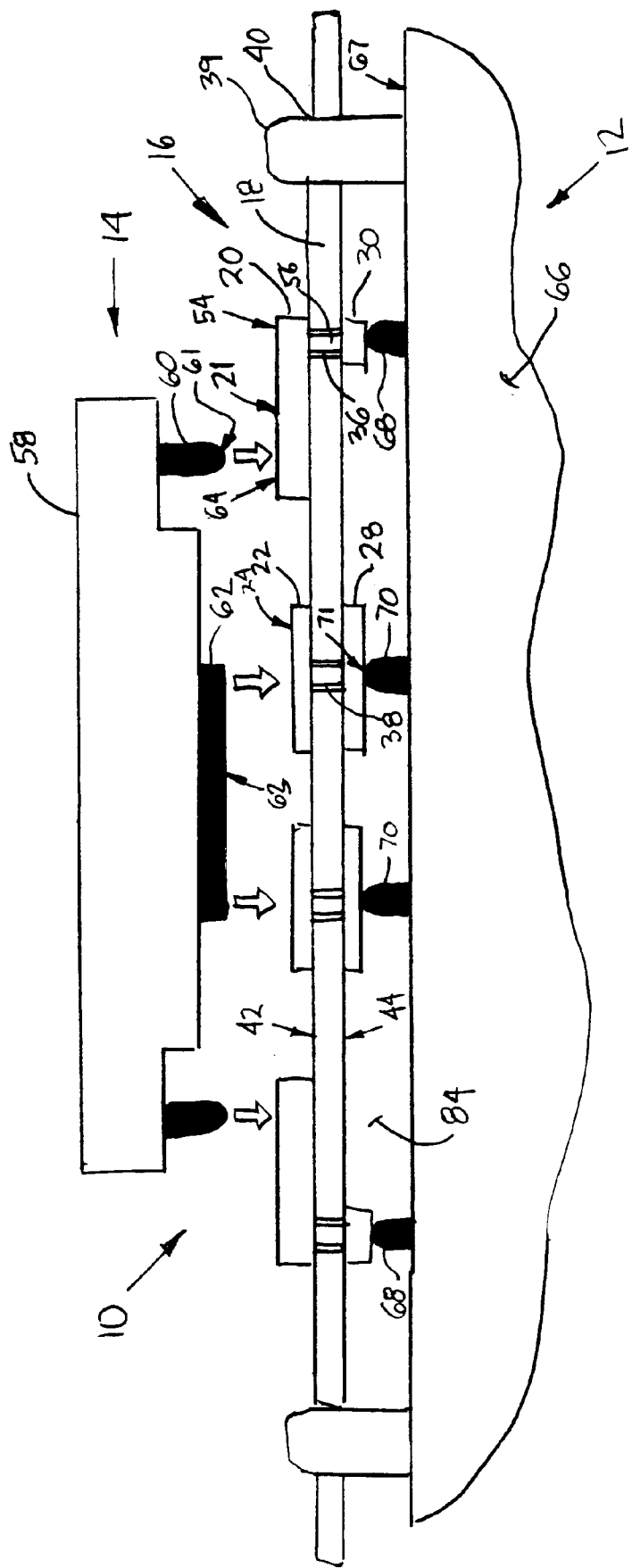
FIG. 1 is a sectioned side view of a test arrangement including a test socket, an electronic device and a test socket interposer, according to an embodiment of the invention.

FIG. 1 of the accompanying drawings illustrates a test arrangement 10, including a test socket 12, an electronic device 14, and a test socket interposer 16, according to an embodiment of the invention.

FIGS. 2 to 4 illustrate the test socket interposer 16 in more detail. The test socket interposer 16 includes a substrate 18, upper signal contacts 20, upper ground contacts 22, lower signal contacts 30, lower ground contacts 28, signal vias 36, and ground vias 38.

The substrate 18 is a multi-layer substrate measuring 14 mm by 14 mm, with a thickness of 125 microns, and is made of a Polytetrafluoroethylene, PTFE, which is non-conductive. Two tooling holes 40 are formed through the substrate 18 near the right and left sides. Holes 41 are formed through the substrate 18 for the signal vias 36 and the ground vias 38. The substrate 18 is flexible and resilient. Further characteristics of the substrate 18 will be evident from the description that follows.

FIG. 2 illustrates that the upper signal contacts 20 include upper signal contacts 20A through 20T plated on the substrate 18. Each upper signal contact 20 is made of copper and is 900 microns in length, 230 microns wide, and is plated to a height of 105 microns above an upper surface 42 of the substrate 18.

The upper signal contacts 20 are positioned in four groups of five each, a rear group including upper signal contacts 20A through 20E; a right-side group including upper signal contacts 20F through 20J; a front group including upper signal contacts 20K through 20O; and a left-side group including upper signal contacts 20P through 20T. Each upper signal contact 20 is positioned along a periphery of a square internal area 46, with the upper signal contacts 20A through 20E opposite the upper signal contacts 20K through 20O and the upper signal contacts 20F through 20J opposite the upper signal contacts 20P through 20T. The upper signal contacts 20A through 20E and 20K through 20O are aligned in a y direction 50, and the upper signal contacts 20F through 20J and 20P through 20T are aligned in an x direction 48.

FIG. 2 illustrates that the upper ground contacts 22 include upper ground contacts 22A through 22D plated on the substrate 18. Each upper ground contact 22 is made of copper, measures 690 microns by 690 microns, and is plated to a height of 70 microns above the upper surface 42 of the substrate 18. The upper ground contacts 22A through 22D are positioned within the internal area 46 in a two by two array, with the rows of the array aligned in the x direction 48 and the columns of the array aligned in the y direction 50.

FIG. 3 illustrates that the lower signal contacts 30 include lower signal contacts 30A through 30T plated on the substrate 18. Each lower signal contact 30 is 250 microns in length, 250 microns wide, and is plated to a height of 70 microns below a lower surface 44 of the substrate 18. Each lower signal contact 30 is paired with one of the upper signal contacts 20 and mirrors the position of the respective upper signal contacts 20 on the lower surface of the substrate 44. Each lower signal contact 30 is positioned relative to one of the respective upper signal contacts 20 directly below an end 54 of the upper signal contact 20 distant from the square internal area 46.

The lower ground contacts 28 are similar to the upper ground contacts 22. Each lower ground contact 22 is made of copper, measures 690 microns by 690 microns, and is plated to a height of 70 microns below the lower surface 44 of the substrate 18. Each lower ground contact 28 is paired with an upper ground contact 22, and mirrors the position of the respective upper ground contacts 22 on the bottom surface 44 of the substrate 18.

FIG. 2 illustrates the signal vias 36 and the ground vias 38 in more detail. The signal vias 36 provide a direct electrical connection through the substrate 18 between the upper signal contacts 20 and the lower signal contacts 30. There are 20 signal vias 36, each connecting one of the upper signal contacts 20 with a respective lower signal contact 30.

The ground vias 38 provide a direct electrical connection through the substrate 18 between the upper ground contacts 22 and the lower ground contacts 28. There are 16 ground vias 38, positioned with each one of the ground vias 38 at a different corner of one of the four upper ground contacts 22. Each ground via 38 is one of a group of four ground vias connecting an upper ground contact 22 with a respective lower ground contact 28.

The signal vias 36 and the ground vias 38 are filled with a silver filler 56. A respective via as together with a respective silver filler 56 forms a respective electrical connection of the test socket interposer 16.

Referring again to FIG. 1, the electronic device 14 includes a device body 58, device signal contacts 60 and a device ground contact 62. The device body 58 houses an integrated circuit, not shown, that needs to be tested before being shipped to a customer. The device signal contacts 60 are made of a conductive material and are electronically connected to the integrated circuit, not shown. There are 20 device signal contacts 60, which are positioned on the device body 58 similarly to the way the upper signal contacts 20 are positioned on the substrate 18. The device ground contact 62 is made of a conductive material and is electronically connected to the integrated circuit. The device ground contact 62 is rectangular and is positioned within the device signal contacts 60. The lower surface 63 of the device ground contact 62 is in the same plane as the ends 61 of the device signal contacts 60.

FIG. 1 also illustrates the test socket 12 in more detail. The test socket 12 includes a socket frame 66, socket signal contacts 68, socket ground contacts 70 and tooling pins 39.

The socket frame 66 is made of a non-conductive material, a portion of the socket frame 66 having a flat, upper surface 67. The socket signal contacts 68 are made of a conductive material and are electronically connected to an electrical circuit, not shown, for testing the electronic device 14. There are 20 socket signal contacts 68, positioned on the upper surface 67 of the socket frame 66 similarly to the way that the lower signal contacts 30 are positioned on the substrate 18.

The socket ground contacts 70 are made of a conductive material and are electronically connected to the electrical circuit, not shown. The socket ground contacts 70 are positioned on the upper surface 67 of the socket frame 66 within the socket signal contacts 68. An upper surface 71 of each of the socket ground contacts 70 is in the same plane as the socket signal contacts 68. There are two tooling pins 39, which are cylindrical and oriented vertically. The tooling pins 39 are positioned on the upper surface 67 of the socket frame 66 similarly to the way that the tooling holes 40 are positioned on the substrate 18.

In use, the test socket interposer 16 is positioned on the test socket 12, as shown in FIG. 1, with each of the tooling pins 39 through the respective tooling holes 40. In this position, each of the socket signal contacts 68 contact each of the respective lower signal contacts 30 and the socket ground contacts 70 contact each of the respective lower ground contacts 28. Also in this position, an air gap 84 is defined under a portion of the bottom surface 44 of the substrate 18 and above the upper surface 67 of the socket frame 66 that is between the socket ground contact 70 and socket signal contact 68.

The electronic device 14 is then moved into a preparatory position above the test socket interposer 16 with the device signal contacts 60 facing the test socket interposer 16.

Figure 5A:
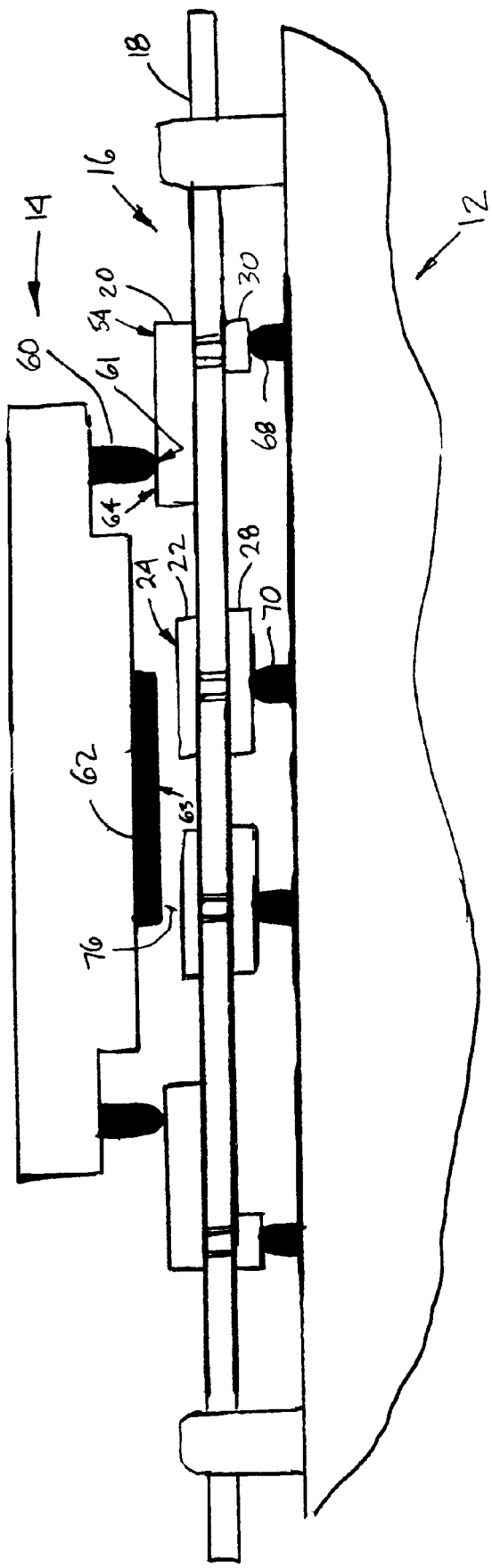
FIG. 5A is a view similar to FIG. 1 after the electronic device is moved down to the test socket interposer and makes partial contact with the test socket interposer.

As shown in FIG. 5A, the electronic device 14 is then moved downward until each one of the ends 61 of the device signal contacts 60 move into contact with the end 64 of the respective upper signal contact 20. With the electronic device 14 and the test socket interposer 16 is this position, an air gap 76 is defined between the lower surface 63 of the device ground contact 62 and an upper surface 24 of the upper ground contact 22.

Figure 5B:
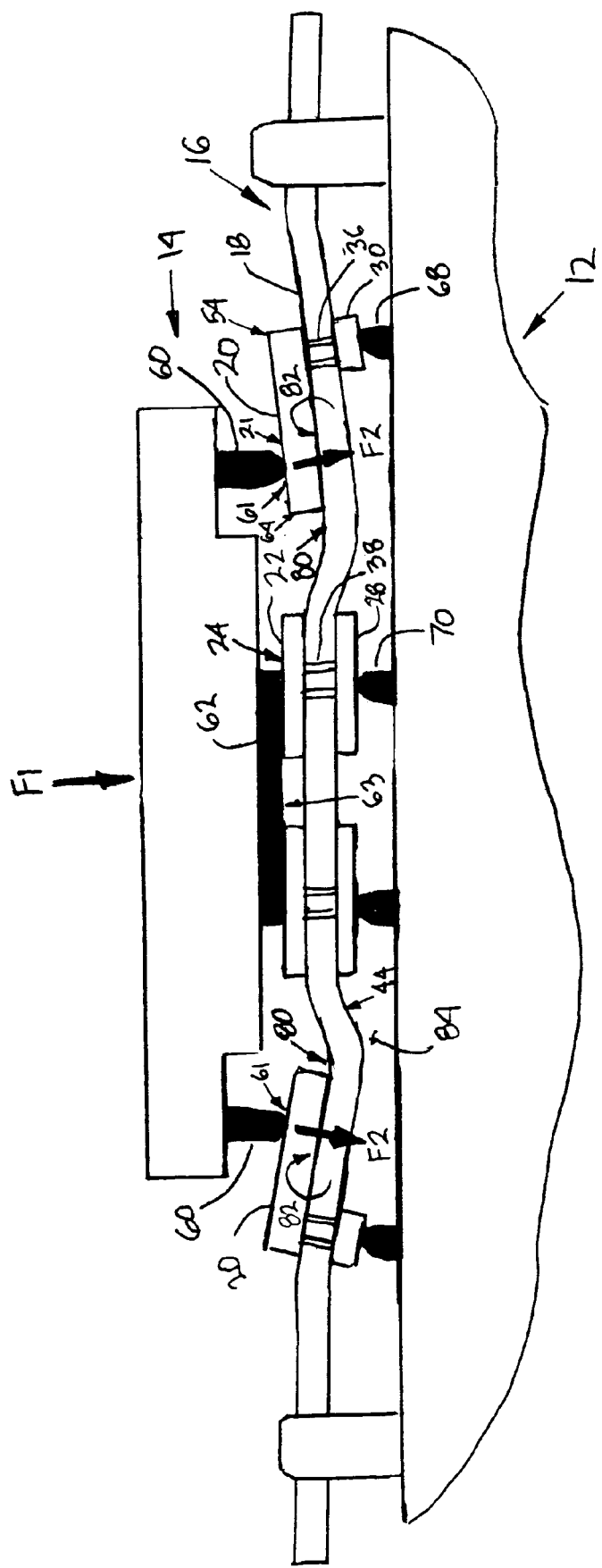
FIG. 5B is a view similar to FIG. 5A after the electronic device is moved further down onto the test socket interposer and makes full contact with the test socket interposer.

As shown in FIG. 5B, the electronic device 14 is then moved further downward until the lower surface 63 of the device ground contact 62 moves into contact with the upper surfaces 24 of the upper ground contacts 22.

The movement of the electronic device 14 downward from the first position shown in FIG. 5A to the second position shown in FIG. 5B is caused by a downward force F1 acting on the electronic device 14. The force F1 causes forces F2 to be exerted by each of the ends 61 of the device signal contacts 60 against the end 64 of the respective upper signal contact 20. The force F2 causes the upper signal contacts 20 to press against the substrate 18. The substrate 18 is sufficiently compliant that depressions 80 are formed underneath the upper signal contacts 20. The air gap 84 under the lower surface 44 of the substrate 18 allows for flexing of the substrate 18 into the air gap 84. The movement of the upper signal contacts 20 into the depressions 80 effectively pivots the upper signal contacts 18 in a direction 82, moving the area of contact between the end 61 of the device signal contact 60 and the upper surface 21 of the upper ground contact 20 downward. Pivoting of the upper signal contacts 20 in the direction 82 allows the lower surface 63 of the device ground contact 62 to move into contact with the upper surfaces 24 of the upper ground contacts 22.

With the test socket interposer 16 in the position illustrated in FIG. 5B, electricity is conducted between the electronic device 14 and the test socket 12. Electricity for the signal is conducted through a path including the device signal contacts 60, the upper signal contacts 20, the signal vias 36, the lower signal contacts 30 and the socket signal contacts 68. Electricity for the ground is conducted through a path including the device ground contact 62, the upper ground contacts 22, the ground vias 38, the lower ground contacts 28 and the socket ground contacts 70. Testing is then performed on the electronic device 14.

After testing is performed, the electricity is turned off. The electronic device 14 is then moved upwards, away from the test socket interposer 16 to the position shown in FIG. 1. This completes one cycle of testing for the electronic device 14.

After a cycle of testing, the test socket interposer 16 is moved to the position shown in FIG. 1. The depressions 80 that are formed in the substrate 18 while in the position shown in FIG. 5B are temporary and the substrate 18 will rebound, or spring back, to the entirely flat condition shown in FIG. 1 after the electronic device 12 is moved out of contact with the test socket interposer 16.

The substrate 18 is sufficiently resilient that the test socket interposer 16 will withstand repeated cycles of testing without permanent deformation of the substrate 18.

In a worst case for strain on the substrate 18, the electronic device 14 might be tested with the ends 61 of the device signal contacts 60 measuring 50 microns below the lower surface 63 of the device ground contact 62. The electronic device 14 in this configuration will produce deeper depressions 80 in the substrate 18 while the test socket interposer 16 is positioned as in FIG. 5B. The depressions 80 that are formed in the substrate 18 are temporary and the substrate 18 will rebound, or spring back, to the entirely flat condition shown in FIG. 1 after the electronic device 12 is moved out of contact with the test socket interposer 16. For the electronic device 14 with these measurements, the substrate 18 is sufficiently resilient that the test socket interposer 16 will withstand, for example, at least 1000 cycles of testing without permanent deformation of the substrate 18.

The electronic device 14 might be tested with the ends 61 of the device signal contacts 60 measuring 35 microns or less above the lower surface 63 of the device ground contact 62. The ends 61 of the device signal contacts 60 for this electronic device 14 are ensured of intimate contact with the upper signal contacts 20 when the electronic device 14 is positioned on the test socket interposer 16 as shown in FIG. 5B.

It can thus be seen that the test socket interposer 16 may compensate for typical manufacturing variations in the lengths of device signal contacts 60 by allowing the area of contact between each of the ends 61 of the device signal contacts 60 and the respective upper signal contact 20 to adjust downwards. The ability of the test socket interposer 16 to compensate for dimensional variations ensures an intimate connection between the device signal contacts 60 and the upper signal contacts 20 and ultimately a more desirable electrical connection between the device signal contacts 60 and the socket signal contacts 68.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A test socket interposer, comprising:
    a horizontal, non-conductive, flexible substrate with a top and bottom surface;
    a lower ground contact and a lower signal contact on the bottom surface of the substrate, positionable on a test socket with the lower ground contact on a socket ground contact and with the lower signal contact on a socket signal contact;
    an upper ground contact and an upper signal contact on the top surface of the substrate, the upper signal contact having a surface, at least a portion of which (i) is higher than an upper surface of the ground contact so that a signal contact of a device in a common plane as a device ground contact contacts the upper signal contact before the device ground contact contacts the upper ground contact when the device is moved downward and (ii) is to the right of a lower surface of the lower signal contact so that a downward force exercised by the device signal contact causes pivoting of the upper signal contact that moves the area of contact between the device signal contact and the upper signal contact downward, the substrate being sufficiently compliant to allow for pivoting of the upper signal contact, and for the device ground contact to subsequently contact the upper ground contact; and
    ground and signal electrical connections, the ground electrical connection linking the upper ground contact with the lower ground contact and the signal electrical connection linking the upper signal contact with the lower signal contact.

2. A test socket interposer as defined in claim 1, wherein the substrate has at least one tooling hole formed through the substrate for positioning over tooling pins, to position the substrate on the test socket.

3. A test socket interposer as defined in claim 1, wherein the lower surface of the lower ground contact and the lower surface of the lower signal contact are in a common plane and wherein an air gap is defined under a portion of the bottom surface of the substrate and above the test socket that is between the socket ground contact and socket signal contact to allow for flexing of the substrate between the lower ground contact and the lower signal contact.

4. A test socket interposer as defined in claim 1, wherein the upper signal contact is longer than the lower signal contact and a portion of the upper signal contact is positioned on the top surface of the substrate directly above a portion of the lower signal contact.

5. A test socket interposer as defined in claim 1, wherein the upper ground contact is positioned on the top surface of the substrate directly above the lower ground contact.

6. A test socket interposer as defined in claim 1, wherein the distance between the lower surface of the lower ground contact and the bottom surface of the substrate is the same as the distance between the lower surface of the lower signal contact and the bottom surface of the substrate.

7. A test socket interposer as defined in claim 1, wherein the distance between the upper surface of the upper signal contact and the top surface of the substrate is greater than the distance between the upper surface of the upper ground contact and the top surface of the substrate.

8. A test socket interposer as defined in claim 1, wherein a downward force exercised by the device signal contact on the upper signal contact causes the upper signal contact to press down against the substrate and form a depression in the top surface of the substrate material under the upper signal contact for the duration that the downward force is exercised.

9. A test socket interposer as defined in claim 8, wherein the depression in the substrate material is located under the side of the upper signal contact closest to the upper ground contact.

10. A test socket interposer as defined in claim 1, wherein at least one of the ground electrical connection linking the upper ground contact with the lower ground contact and the signal electrical connection linking the upper signal contact with the lower signal contact is a via.

11. A test socket interposer as defined in claim 10, further comprising a material filling the void in the via.

12. A test socket interposer as defined in claim 1, further comprising a plurality of upper signal contacts.

13. A test socket interposer as defined in claim 12, wherein a plurality of upper signal contacts are all positioned on a perimeter of an area on the top surface of the substrate and the upper ground contacts are all positioned on the top surface of the substrate in the area within the upper signal contacts.

14. A test socket interposer as defined in claim 13, wherein at least two of the upper signal contacts are in a line on the right side of the area and at least two of the upper signal contacts are in a line on the left side of the area.

15. A test socket interposer as defined in claim 12, wherein one of the upper signal contacts is positioned on the right side of the upper ground contact and one of the upper signal contacts is positioned on the left side of the upper ground contact.

16. A test socket interposer as defined in claim 15, wherein the upper surface of the upper signal contact on the right side and the upper surface of the upper signal contact on the left side are the same distance above the top surface of the substrate.

17. A test socket interposer as defined in claim 15, wherein the upper surfaces of the upper signal contacts are higher than the upper surface of the upper ground contact so that a device comprising of a signal contact on the right side of the device, a signal contact on the left side of the device, and a ground contact in a common plane with the device signal contacts, will make contact with the right and left upper signal contacts before the upper surface of the upper ground contact.

18. A test socket interposer as defined in claim 17, wherein a downward force exercised by the right and left device signal contacts on the right and left upper signal contacts causes pivoting of the upper signal contacts that moves the areas of contact between the right and left device signal contacts and the upper signal contacts downward, the substrate being sufficiently compliant to allow for pivoting of the upper signal contacts, and for the device ground contact to subsequently contact the upper ground contact.

19. A test socket interposer, comprising:

a horizontal, non-conductive, flexible substrate with a top and bottom surface;

a lower ground contact and a lower signal contact on the bottom surface of the substrate, positionable on a test socket with the lower ground contact on a socket ground contact and with the lower signal contact on a socket signal contact;

an upper ground contact and an upper signal contact on the top surface of the substrate, the upper signal contact having a surface, at least a portion of which (i) is higher than an upper surface of the ground contact and so that a signal contact of a device in a common plane as a device ground contact contacts the upper signal contact before the device ground contact contacts the upper ground contact when the device is moved downward, (ii) is located vertically above the top surface of the substrate a greater distance than the height of the upper ground contact measured from the top surface of the substrate, and (iii) is to the right of a lower surface of the lower signal contact so that a downward force exercised by the device signal contact causes pivoting of the upper signal contact by pressing the upper signal contact down against the substrate and forms a depression in the top surface of the substrate material under the upper signal contact allowing the area of contact between the device signal contact and the upper signal contact to move downward, the substrate being sufficiently compliant to allow for pivoting of the upper signal contact, and for the device ground contact to subsequently contact the upper ground contact; and a ground and signal electrical connection in the substrate, the ground electrical connection linking the upper ground contact with the lower ground contact and the signal electrical connection linking the upper signal contact with the lower signal contact.

20. A test socket interposer, comprising:

a horizontal, nonconductive, flexible substrate with a top and a bottom surface;

an upper ground contact on the top surface and having a first thickness;

a lower ground contact on the bottom surface;

a ground electrical connection in the substrate and linking the upper ground contact with the lower ground contact;

a plurality of upper signal contacts around the upper ground contact, each having a second thickness that is more than the first thickness so as to have upper surfaces above an upper surface of the upper ground contact;

a plurality of lower signal contacts on the bottom surface, each below a respective portion only of respective ones of the upper signal contacts; and a plurality of signal electrical connections in the substrate, each linking a respective one of the portions of the upper signal contacts with a respective one of the lower signal contacts.

21. A method for testing a device using an interposer, the device having a signal contact and a ground contact, and the interposer having a substrate, a lower ground contact, a lower signal contact, an upper ground contact and an upper signal contact, comprising:

positioning the interposer on the test socket;

moving a device downward until the device signal contact makes contact with the upper surface of the upper signal contact and before the device ground contact makes contact with the upper ground contact;

exerting a downward force on the upper signal contact with the device signal contact to cause pivoting of the upper signal contact, the substrate material being sufficiently compliant to allow for a portion of an area of contact of the device and the upper signal contact to move downward to allow subsequent contact of the device ground contact with the upper ground contact; and conducting electricity between the device and the test socket via the contacts.

* * * * *